United States Patent [19]

Ulmer et al.

[11] Patent Number: 4,477,737

[45] Date of Patent: Oct. 16, 1984

[54] VOLTAGE GENERATOR CIRCUIT HAVING COMPENSATION FOR PROCESS AND TEMPERATURE VARIATION

[75] Inventors: Richard W. Ulmer; Roger A. Whatley, both of Austin, Tex.

[73] Assignee: Motorola, Inc., Schaumburg, Ill.

[21] Appl. No.: 398,033

[22] Filed: Jul. 14, 1982

[51] Int. Cl.³ .......... G05F 1/58; H03L 1/04

[52] U.S. Cl. .......... 307/297; 307/491; 307/497; 323/316

[58] Field of Search .......... 307/297, 491, 496, 497; 330/264, 266, 288, 289; 323/316

[56] References Cited

U.S. PATENT DOCUMENTS

| | | | |
|---|---|---|---|
| 4,128,816 | 12/1978 | Shimotsuma | 307/297 X |
| 4,260,946 | 4/1981 | Wheatley, Jr. | 307/297 X |
| 4,300,061 | 11/1981 | Mihalich et al. | 307/297 |
| 4,361,797 | 11/1982 | Kojima et al. | 307/297 X |
| 4,399,374 | 8/1983 | Boeke | 330/288 X |
| 4,410,813 | 10/1983 | Barker et al. | 307/297 X |
| 4,430,582 | 2/1984 | Bose et al. | 307/297 |

*Primary Examiner*—Stanley D. Miller
*Assistant Examiner*—David R. Hudspeth
*Attorney, Agent, or Firm*—Anthony J. Sarli, Jr.; Jeffrey Van Myers; Robert L. King

[57] ABSTRACT

An on-chip voltage generator circuit is disclosed having an output voltage which is reduced by a predetermined amount from a supply voltage. The output voltage is proportional to the gate-to-source voltages of two complementary transistors and varies with temperature and processing in a similar manner with digital circuitry on the chip for which the output voltage may be used to operate. A current source is used to provide a known current to the two complementary transistors and a buffer is used to provide a low impedance output.

5 Claims, 2 Drawing Figures

VOLTAGE GENERATOR CIRCUIT HAVING COMPENSATION FOR PROCESS AND TEMPERATURE VARIATION

CROSS REFERENCE TO RELATED APPLICATIONS

Related subject matter can be found in U.S. Pat. No. 4,342,926, entitled "BIAS CURRENT REFERENCE CIRCUIT", filed Nov. 18, 1980 by Roger A. Whatley and assigned to the assignee hereof.

TECHNICAL FIELD

This invention relates generally to voltage generators, and, more particularly, to integrated voltage generator circuits which provide a voltage which is reduced from a supply voltage.

BACKGROUND ART

Typically, CMOS integrated circuitry has two voltage potentials associated therewith which are known in the art as a supply voltage $V_{DD}$ and a reference voltage $V_{SS}$. The supply voltage $V_{DD}$ is commonly a more positive voltage than the reference voltage $V_{SS}$. For circuit operation where the difference in voltage potential between $V_{DD}$ and $V_{SS}$ is approximately eight volts or greater, some processes, such as a silicon gate process, having small device geometries, such as five microns and less, utilize digital logic circuits which may latch-up and maintain false or erroneous data. To overcome this problem, a reduced supply voltage, which is internal to an integrated circuit chip and negative with respect to $V_{DD}$, is provided to operate digital logic circuits at a sufficiently low voltage to prevent latch-up. Internal reduced supply voltages previously have been provided by coupling a first terminal of a Zener diode to the supply voltage $V_{DD}$ and coupling a second terminal of the Zener diode to both a current source and an input of a buffer amplifier. An output of the buffer amplifier provides the reduced internal voltage. A typical Zener diode has a fixed temperature coefficient of approximately +5 millivolt per degree Centigrade.

Others have used series-connected bipolar type diodes which each have a fixed voltage drop of approximately 0.7 volt to provide an internal reduced supply voltage. Size disadvantages are obvious when a substantially reduced voltage is desired because a plurality of diodes must be used. Further, bipolar diodes display a stable negative temperature coefficient of approximately −2 millivolts per degree Centigrade. Others have also coupled a Zener diode in series with a bipolar diode in an attempt to provide a reduced supply voltage displaying a 0 millivolt per degree Centigrade temperature coefficient. These types of internal voltage generators are intended to produce an internal supply voltage that is substantially independent of process and temperature. However, a fixed supply voltage does not compensate devices powered by the power supply (i.e. inverters, NAND gates, etc.) for propagation delay time as a function of process and temperature.

BRIEF SUMMARY OF THE INVENTION

It is an object of the present invention to provide an improved voltage generator.

Another object of the present invention is to provide an improved voltage generator which tracks temperature and process variations associated with circuitry which the voltage generator is powering.

A further object of the present invention is to provide an improved voltage generator which provides a voltage having a substantially non-zero temperature coefficient of proper sign and magnitude to compensate for propagation delays created by process and temperature variation associated with devices which the voltage generator is powering.

Yet another object of the present invention is to provide an improved integrated CMOS internal voltage generator which tracks process and temperature variations associated with a CMOS circuit with an operating voltage primarily greater than five volts.

In carrying out the above and other objects of the present invention, there is provided, in one form, a voltage generator having reference voltage means comprising two diode-connected devices of opposite conductivity type coupled in series. A first diode-connected device is coupled to a supply voltage and a second diode-connected device is coupled to both a current source and an input of a buffer means. The current source is coupled to a reference voltage. By using the gate-to-source voltage, $V_{GS}$, of the two diode-connected devices when operated at a specific current by the current source, the buffer means provide an output supply voltage which is reduced a predetermined amount below the supply voltage and which may be used as an internal supply for digital logic. The use of devices having electrical characteristics which are matched to corresponding electrical characteristics of the digital logic allows the voltage generator to provide a voltage which changes with temperature and process variation in such a manner as to substantially cancel the variation of propagation delays over process and temperature.

The above and other objects, features and advantages of the present invention will be more clearly understood from the following detailed description taken in conjunction with the accompanying drawings.

DESCRIPTION OF THE PREFERRED EMBODIMENT

Figure 1:
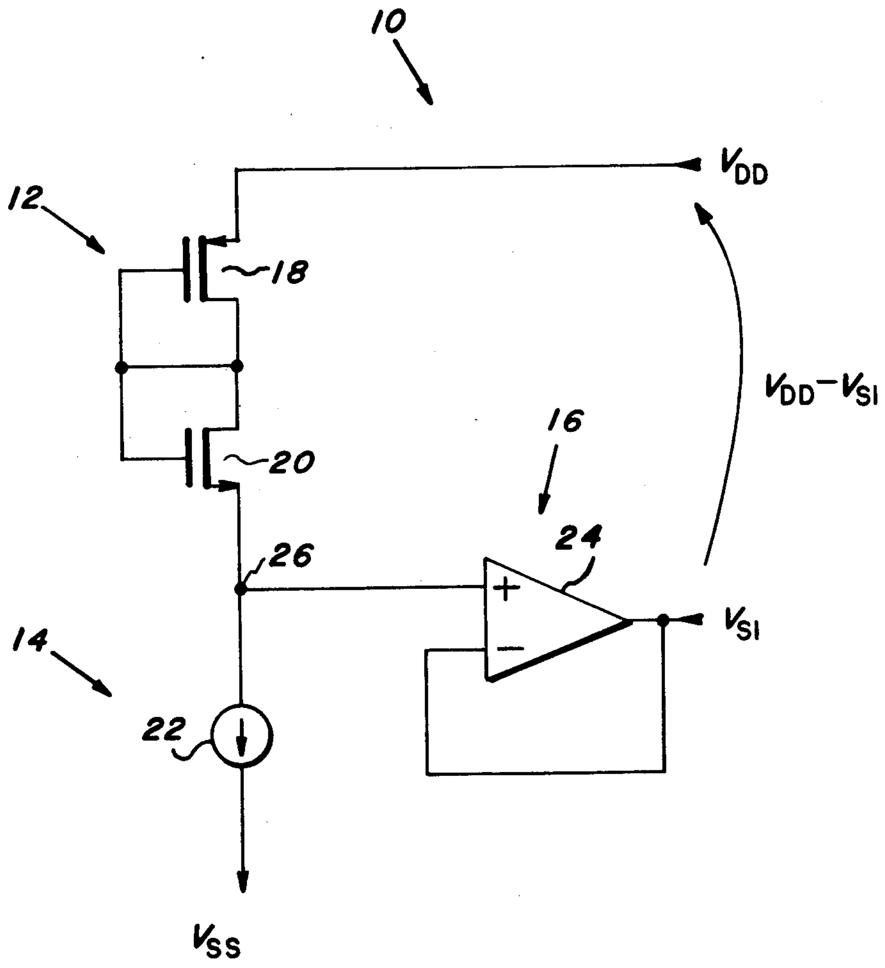
FIG. 1 illustrates in schematic form a voltage generator constructed in accordance with a preferred embodiment of the present invention.

Shown in FIG. 1 is an internal voltage generator 10 which is comprised generally of a reference voltage section 12, a current source section 14 and an output buffer section 16. While specific N-channel and P-channel MOS devices are shown, it should be clear that voltage generator 10 could be implemented by completely reversing the processing techniques (e.g. P-channel to N-channel). Further, it should be clear that voltage generator 10 could be implemented in other processes such as N-channel.

Reference voltage section 12 comprises a P-channel transistor 18 having a source or current electrode coupled to a supply voltage $V_{DD}$ and a gate electrode coupled to a drain or current electrode. An N-channel transistor 20 has a drain or current electrode connected to a gate electrode and coupled to both the gate and drain electrodes of P-channel transistor 18. Current source section 14 comprises a current source 22 which has a first terminal coupled to a source electrode of N-channel transistor 20 and a second terminal coupled to a reference ground potential, $V_{SS}$. Output buffer section 16 comprises an operational amplifier 24 having a noninverting input coupled to both the source electrode of transistor 20 and the first terminal of current source 22 at a node 26. An inverting input terminal of operational amplifier 24 is coupled to an output terminal which provides an output supply voltage, $V_{SI}$, which is reduced in magnitude from $V_{DD}$.

In operation, voltage reference 12 provides a voltage potential equal to the sum of the gate-to-source voltages of transistors 18 and 20 between node 26 and supply voltage $V_{DD}$. Since node 26 is a high impedance node, operational amplifier 24 buffers the output voltage and provides a low impedance output. The output supply voltage $V_{SI}$ exists at the output of operational amplifier 24, for operating digital logic (not shown) at a reduced supply voltage equal to the difference in potential between $V_{DD}$ and $V_{SI}$. In this application, $V_{DD}$ and $V_{SI}$ are known as supply rails. Digital logic commonly includes inverter circuits which have a propagation delay, $t_d$, associated therewith. The propagation delay may be represented mathematically as a function of process, temperature, supply voltage, device geometry and loading characteristics. The output voltage of the circuit shown in FIG. 1, $V_{DD}-V_{SI}$, is a function of process, temperature, device geometry, and bias current. In particular, both the propagation delay of digital logic and the digital supply voltage $V_{DD}-V_{SI}$ are functions of process and temperature. Because the digital logic and voltage generator are fabricated on the same integrated circuit chip in close thermal proximity, the change in one tends to track changes in the other. For example, under given process conditions, if the operating temperature is elevated the propagation delay of MOS inverters is increased. However, the supply voltage $V_{DD}-V_{SI}$ is also increased and thus tends to compensate for changes in propagation delay. At a given temperature, if the processing is worse than nominal, the supply voltage $V_{DD}-V_{SI}$ increases to compensate the slower propagation delay that would have resulted from using a fixed supply voltage. Therefore, voltage reference 12 tracks temperature and process variations in a manner so as to substantially cancel the propagation delay dependence on temperature and process of any coupled logic gates operating at a $V_{DD}-V_{SI}$ potential. It should be clear that voltage reference 12 may also be implemented as a diode-connected device of the same process type as the digital circuitry or as a plurality of diode-connected devices.

Figure 2:
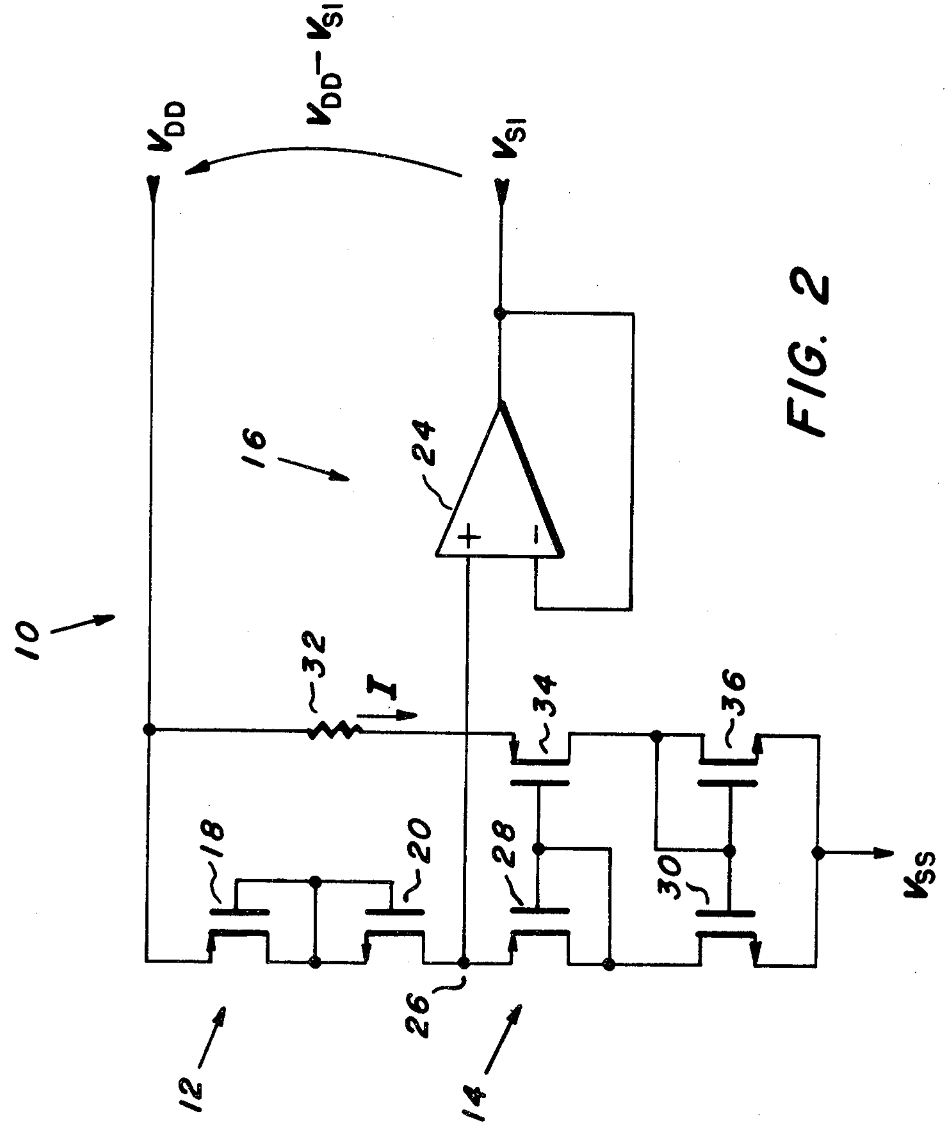
FIG. 2 illustrates in schematic form an alternative embodiment of the present invention.

Although reference voltage section 12 of FIG. 1 varies the difference in potential between $V_{DD}$ and $V_{SI}$ with variations in temperature and process, current source 22 has not been described as varying with temperature and process. Shown in FIG. 2 is another embodiment of the invention wherein voltage generator 10 comprises a reference voltage section 12, a current source section 14 and an output buffer section 16. In this embodiment, current source section 14 provides a bias current for reference voltage section 12 wherein the bias current is also process and temperature varying in the same manner as the devices which may be powered by voltage generator 10.

Reference voltage section 12 again comprises P-channel transistor 18 having a source electrode coupled to a supply voltage $V_{DD}$ and a gate electrode coupled to a drain electrode. As in the previous embodiment, N-channel transistor 20 has a drain electrode connected to a gate electrode which are both coupled to both the gate and drain electrodes of P-channel transistor 18.

Current source section 14 comprises a P-channel transistor 28 having a source electrode connected at a node 26 to both a source electrode of transistor 20 and a noninverting input of operational amplifier 24. Transistor 28 has both a gate electrode and a drain node 26 to both a source electrode of transistor 20 and a noninverting input of operational amplifier 24. Transistor 28 has both a gate electrode and a drain electrode connected together. An N-channel transistor 30 has a drain electrode connected to both the drain and gate electrodes of transistor 28 and a source electrode coupled to the reference ground potential $V_{SS}$. A resistor 32 has a first terminal coupled to supply voltage $V_{DD}$ and a second terminal coupled to a source electrode of a P-channel transistor 34. Transistor 34 has a gate electrode connected to both the gate and drain electrodes of transistor 28. An N-channel transistor 36 has a drain electrode connected to its gate electrode and both drain and gate electrodes are connected to both a drain electrode of transistor 34 and the gate electrode of transistor 30. A source electrode of transistor 36 is coupled to the reference ground potential $V_{SS}$.

Output buffer section 16 again comprises operational amplifier 24 having a noninverting input coupled to both reference voltage section 12 and current source section 14 at node 26, and an inverting input coupled to an output, for providing output voltage $V_{SI}$.

In operation, a varying voltage equal to the sum of the gate-to-source voltages of transistors 18 and 20 is reflected across resistor 32. The gate-to-source voltage of transistors 18 and 20 creates a current, I, through resistor 32 which is determined in part by the value of resistor 32. The current I flows through transistors 34 and 36 and is mirrored by transistors 30 and 36 to also flow through transistor 28. When the gate widths and lengths of transistors 28 and 34 and transistors 30 and 36 are substantially identical, the same current flows through transistors 28 and 34. Therefore, the current flowing through transistors 18 and 20 is controlled by the process variation of the $V_{GS}$ of transistors 18 and 20. The result of this is to cause an even greater variation of $(V_{DD}-V_{SI})$ as a function of process and temperature than in the circuit of FIG. 1, resulting in improved compensation of digital propagation delay. In FIG. 2, the noninverting input of operational amplifier 24 may be coupled to the source electrode of transistor 34 rather than to node 26. The same voltage exists at both points provided transistors 28 and 34 and transistors 30 and 36 are respectively identical.

By now it should be appreciated that a voltage generator which provides a reduced internal supply voltage for integrated digital logic circuits has been provided. Further, the internal supply voltage varies with respect to process and temperature changes in a manner analogous to the same variation in the digital logic circuits.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. A voltage generator, for providing an output voltage which is reduced a predetermined amount from a supply voltage, to electronic circuitry having devices of a predetermined process type, comprising:

reference voltage means coupled to said supply voltage comprising a diode-connected device of said predetermined process type having electrical characteristics which are matched to corresponding electrical characteristics of said electronic circuitry, for providing a reference voltage;

reference current means coupled to said supply voltage, for providing a reference current proportional to said reference voltage;

current source means having first and second transistors, said first transistor having a first current electrode coupled to the reference voltage means, and a control electrode connected to a second current electrode thereof for providing a first current, said second transistor having a first current electrode coupled to the reference current means, a control electrode connected to the control electrode of the first transistor, and a second current electrode for providing a second current;

current mirror means coupled between said current source means and a second supply voltage, for making the first current proportional to the second current; and buffer means having an input coupled to both said reference voltage and the first current electrode of the first transistor, for providing said output voltage which tracks process and temperature variations of the devices of said electronic circuitry.

2. The voltage generator of claim 1 wherein said reference voltage means further comprise:

a third transistor of a first conductivity type having a first current electrode coupled to said supply voltage, and a second current electrode and a control electrode connected together; and a fourth transistor of a second conductivity type having both a first current electrode and a control electrode connected together and coupled to both the control and second current electrodes of said first transistor, and a second current electrode coupled to both said current source means and said buffer means.

3. The voltage generator of claim 1 wherein said buffer means comprise:

an operational amplifier having a noninverting input coupled to both said reference voltage means and said first current electrode of the first transistor, and an inverting input coupled to receive said output voltage.

4. The voltage generator of claim 1 wherein said reference current means is an impedance.

5. A voltage generator, for providing an output voltage which is reduced a predetermined amount from a first supply voltage, to electronic circuitry having devices of a predetermined process type, comprising:

reference voltage means coupled to said supply voltage comprising a diode-connected device of said predetermined process type having electrical characteristics which are matched to corresponding electrical characteristics of said electronic circuitry, for providing a reference voltage;

reference current means coupled to said supply voltage, for providing a reference current proportional to said reference voltage;

current source means having first and second transistors, said first transistor having a first current electrode coupled to the reference voltage means, and a control electrode connected to a second current electrode thereof for providing a first current, said second transistor having a first current electrode coupled to the reference current means, a control electrode connected to the control electrode of the first transistor, and a second current electrode for providing a second current;

a third transistor having a first current electrode coupled to the second current electrode of the first transistor, a control electrode, and a second current electrode for receiving a second supply voltage;

a fourth transistor having both a first current electrode and a control electrode connected together and coupled to both the control electrode of said third transistor and the second current electrode of said second transistor, and a second current electrode coupled to the second current electrode of the third transistor; and buffer means having an input coupled to both the reference voltage and the first current electrode of the first transistor, for providing the output voltage.

* * * * *